United States Patent
Delehouze et al.

(10) Patent No.: US 11,578,003 B2
(45) Date of Patent: Feb. 14, 2023

(54) PROCESS FOR DEPOSITING A COATING ON SHORT FIBRES BY CALEFACTION

(71) Applicants: SAFRAN CERAMICS, Le Haillan (FR); CENTRE NATIONAL DE LA RECHERCHE SCIENTIFIQUE, Paris (FR); UNIVERSITE DE BORDEAUX, Bordeaux (FR)

(72) Inventors: Arnaud Delehouze, Moissy-Cramayel (FR); Fanny Petibon, La Muraz (FR)

(73) Assignees: SAFRAN CERAMICS, Le Haillan (FR); CENTRE NATIONAL DE LA RECHERCHE SCIENTIFIQUE, Paris (FR); UNIVERSITE DE BORDEAUX, Bordeaux (FR)

(*) Notice: Subject to any disclaimer, the term of this patent is extended or adjusted under 35 U.S.C. 154(b) by 366 days.

(21) Appl. No.: 16/957,976

(22) PCT Filed: Dec. 18, 2018

(86) PCT No.: PCT/FR2018/053382
§ 371 (c)(1),
(2) Date: Jun. 25, 2020

(87) PCT Pub. No.: WO2019/129950
PCT Pub. Date: Jul. 4, 2019

(65) Prior Publication Data
US 2020/0331808 A1      Oct. 22, 2020

(30) Foreign Application Priority Data

Dec. 26, 2017 (FR) ......................................... 1763216

(51) Int. Cl.
C04B 35/628    (2006.01)
C23C 18/14     (2006.01)

(52) U.S. Cl.
CPC .. *C04B 35/62873* (2013.01); *C04B 35/62863* (2013.01); *C04B 35/62868* (2013.01);
(Continued)

(58) Field of Classification Search
CPC .............. C23C 18/14; C04B 35/62873; C04B 35/62863
See application file for complete search history.

(56) References Cited

U.S. PATENT DOCUMENTS 5,733,611 A * 3/1998 Thurston ............... C23C 16/045
427/591
5,885,519 A * 3/1999 Baldus .............. C04B 35/62227
264/627

(Continued)

FOREIGN PATENT DOCUMENTS

| EP | 0 515 186 A2 | 11/1992 |
| EP | 0 592 239 A2 | 4/1994 |
| WO | WO 95/14645 A1 | 6/1995 |

OTHER PUBLICATIONS

International Search Report as issued in International Patent Application No. PCT/FR2018/053382, dated Mar. 15, 2019.

(Continued)

*Primary Examiner* — Robert A Vetere
(74) *Attorney, Agent, or Firm* — Pillsbury Winthrop Shaw Pittman LLP

(57) ABSTRACT

A process for depositing a coating on short fibres of carbon or silicon carbide from a coating precursor, the short fibres having a length of between 50 μm and 5 mm, the process including at least heating the short fibres by placing a mixture including the fibres and a liquid phase of the coating precursor in a microwave field so as to bring the surface of the fibres to a temperature allowing the coating on the fibres from the coating precursor to be formed by calefaction.

6 Claims, 1 Drawing Sheet

(52) U.S. Cl.
CPC ........ *C04B 35/62871* (2013.01); *C23C 18/14* (2013.01); *C04B 2235/526* (2013.01); *C04B 2235/5244* (2013.01); *C04B 2235/723* (2013.01)

(56) References Cited

U.S. PATENT DOCUMENTS

| | | | | |
|---|---|---|---|---|
| 6,143,376 A | * | 11/2000 | Linn | ........................ C22C 47/12 |
| | | | | 427/249.4 |
| 2007/0154639 A1 | * | 7/2007 | Malinger | ................ C23C 26/00 |
| | | | | 427/532 |
| 2016/0009602 A1 | * | 1/2016 | Brun | ................. C04B 35/62871 |
| | | | | 156/89.11 |
| 2017/0122882 A1 | * | 5/2017 | Preosti | ................... G01N 22/04 |

OTHER PUBLICATIONS

"Cavite résonnante," Wikipedia, Nov. 2017, XP05509208, Retrieved from the Internet: URL:https://fr.wikipedia.org/wiki/Cavite_resonnante, 4 pages.

Klein, C., "Etude du procédé de densification par caléfaction de composites CIC, modélisation, optimisation du contrôle et du bilan énergétique," Dec. 2015, XP055508985, URL:https://www.theses.fr/2015BORD0231 [retrieved on Sep. 24, 2018].

"Resultats Concours Doctorants Sampe Europe 2017 Materials & Processes," Nov. 2017, XP05508935, Retrieved from the Internet: URL:http://www.sampe-france.org/?q=en/content/resultats-concours-doctorants-sampe-europe-2017-materials-processes, [retrieved on Sep. 21, 2018], 3 pages.

\* cited by examiner

PROCESS FOR DEPOSITING A COATING ON SHORT FIBRES BY CALEFACTION

CROSS-REFERENCE TO RELATED APPLICATIONS

This application is the U.S. National Stage of PCT/FR2018/053382, filed Dec. 18, 2018, which in turn claims priority to French patent application number 1763216 filed Dec. 26, 2017. The content of these applications are incorporated herein by reference in their entireties.

BACKGROUND OF THE INVENTION

The present invention relates to the general field of processes for depositing a coating on fibres, and more particularly on short carbon or silicon carbide fibres, by calefaction from a precursor of the coating.

Ceramic matrix composite (CMC) materials, known for their good mechanical properties that make them suitable for use as structural elements and for maintaining these properties at high temperatures, are a viable alternative to traditional metal parts. Their reduced mass compared to their metallic equivalent makes them the ideal choice to respond to the problems of increasing efficiency and reducing polluting emissions from engines in the aeronautical field.

Parts made of CMC material comprise a generally continuous fibrous reinforcement in the form of a woven textile, which is densified by a ceramic matrix. The fibrous reinforcement thus consists of continuous long fibres, the orientation of which can be adapted to the main stress directions of the part during use. The preform to form the fibre reinforcement must be woven from the continuous fibres to the dimensions of the workpiece (for example two-dimensional or three-dimensional weaving) using a suitable loom. The weaving step is a long and expensive process that is unsuitable for making small parts.

One solution for producing small parts is to obtain them by a process using a mixture of short fibres and a removable binder which is shaped into a blank, the binder is then removed from the blank and finally consolidated by heat treatment. However, the introduction of processes of this type poses the problem of interphase deposition on these fibres.

Techniques are known for the deposition of an interphase on continuous fibres or textiles woven from such fibres, which involve the infiltration or gas phase deposition (CVI/CVD) of these fibres from a gaseous precursor of the interphase. The problem with these techniques is that the fibres must then be cut to form short fibres, which can damage the interphase and result in poor mechanical properties of the CMC material obtained after densification.

Therefore, there is a need for a short fibre coating process that allows a homogeneous and continuous interphase coating to be deposited directly on short fibres over the entire fibre surface.

SUBJECT MATTER AND SUMMARY OF THE INVENTION

The main purpose of the present invention is therefore to overcome such disadvantages by providing a process for depositing a coating on short carbon or silicon carbide fibres from a coating precursor, the short fibres having a length of between 50 μm and 5 mm, the process comprising at least heating the short fibres by placing a mixture comprising said fibres and a liquid phase of the coating precursor in a microwave field so as to bring the surface of the fibres to a temperature allowing the coating on the fibres from the coating precursor to be formed by calefaction.

The process according to the invention is remarkable in particular by the fact that the short fibres are heated by means of microwaves and that the deposition is made directly on them by calefaction. The inventors have indeed observed that short fibres made of carbon or silicon carbide couple directly with a microwave field, which makes it possible to bring their surface to a temperature sufficient to carry out the formation of the coating by calefaction from a liquid phase precursor of this coating. In particular, the surface of the fibres can be heated to a temperature much higher than the cracking temperature of the coating precursor. Each short fibre becomes a kind of stand-alone calefaction reactor. Unlike certain techniques of the prior art, each short fibre is completely covered by the coating, i.e. its generally cylindrical lateral surface and its ends when a short fibre is identified with a cylinder. This process thus makes it possible to deposit the coating directly on the short fibres in a simple and homogeneous way. Another advantage of the process according to the invention is that the coating precursor in the liquid phase can also couple with the microwave field, thus increasing its temperature, reducing heat dissipation around the short fibres and improving the kinetics of calefaction. The coupling of the liquid phase of the precursor with the microwave field can also bring it to boiling point, which has the effect of improving the homogenization of the mixture and thus the coating deposit. Another advantage of the invention is the reduction of the energy required to form the coating because the fibres are heated directly.

A fibre may comprise a plurality of filaments, in which case "surface area of a fibre" means the surface area of each filament that makes up the fibre. Similarly, "depositing" or "forming" a coating on a fibre means depositing or forming the coating on the surface of each filament that composes the fibre, where applicable.

"Microwave field" means an electromagnetic field with a frequency of several hundred MHz to several GHz. The microwave field can be characterized by its power (or amplitude) and frequency, which can be easily determined by the person skilled in the art to obtain a surface temperature of the short fibres sufficient to form the coating by calefaction. There is indeed a multiplicity of frequency/power combinations which make it possible to obtain sufficient coupling between the short fibres and the microwave field.

Note that long fibres are generally longer than 5 mm.

In an example embodiment, the microwave field has a main frequency between 2.35 GHz and 2.55 GHz.

In an example embodiment, the length of the short fibres can be between 100 μm and 300 μm.

In an example embodiment, the coating can be an interphase coating. The interphase has a defragmenting function of the composite material which promotes the deflection of possible cracks reaching the interphase after having propagated in the matrix, preventing or delaying the rupture of fibres by such cracks. This interphase also protects the short fibres of the matrix material during its formation.

In this case, the coating may comprise pyrolytic carbon (PyC), boron nitride (BN) or silicon carbide (SiC). The interphase coating may, for example, comprise $Si_3N_4$ or SiBN.

In an example embodiment, the short fibres can be made of silicon carbide with an oxygen content of less than or equal to 1 atomic percent. For example, such a fibre may be a Hi-Nicalon type S fibre marketed by the Japanese company NGS.

In an example embodiment, the microwave field can be obtained using a resonator with a resonant cavity. In this case, the only parameter to be set to modulate the surface temperature of the fibres is the power supplied to the resonator, as the resonator usually has a fixed resonant frequency. Care can be taken that the short fibres and the liquid-phase precursor are placed within an antinode of the microwave field, which is the case when such a resonator is used and the fibres and the precursor are placed in the centre of its resonant cavity. Of course, other means of generating microwaves can be used.

BRIEF DESCRIPTION OF THE DRAWINGS

Other features and advantages of the present invention will be apparent from the description given below, with reference to the appended drawing, which illustrates an example embodiment without any limiting character.

DETAILED DESCRIPTION OF THE INVENTION

Figure 1:
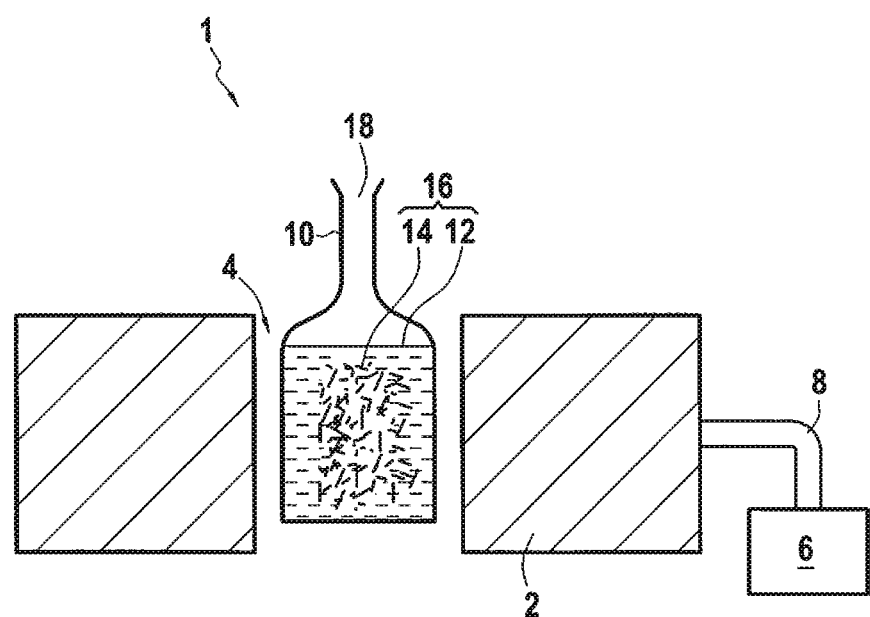
FIG. 1 shows an example of a device for implementing a process according to the invention.

FIG. 1 shows a device for carrying out a process according to the invention.

The device 1 comprises a resonator 2 with a resonant cavity 4, the resonator is connected to a wave generator 6 by a coaxial cable 8. During operation, a microwave field passes through the resonant cavity 4. A reactor 10 made of a material which is preferably transparent to microwaves (for example quartz) is placed inside the resonant cavity 4. The reactor 10 takes the form of a vial. The reactor 10 contains a liquid phase 12 of a coating precursor in which short fibres 14 of carbon or silicon carbide are present, together forming a mixture 16. The short fibres 14 are dispersed in the liquid phase 12, i.e. they are not bonded together and do not form a part preform at this stage. The reactor 10 can be provided at its opening 18 with means for feeding the liquid phase 12 of the precursor into the reactor, for example an addition bulb, and with means for preventing the escape of the vaporized precursor, for example a reflux arrangement (not shown). The device 1 may additionally comprise conventional means for homogenizing the mixture 16, for example a magnetic stirrer or a quartz propeller (not shown).

In order to deposit a coating on the short fibres by a process according to the invention, the generator 6 is activated, which has the effect of creating a microwave field in the resonant cavity 4 in which the reactor 10 is present. The short fibres 14 are coupled with the microwave field, which has the effect of heating them, in particular by increasing their surface temperature. When the power of the microwave field is sufficient, the liquid phase of the coating precursor 12 vaporizes in the vicinity of the short fibres 14 and the precursor thus vaporized can form the coating directly on the short fibres by calefaction.

As mentioned above, the skilled person can determine the power (and/or frequency if variable) of the microwave field to obtain sufficient coupling and the right temperature for heat deposition. Similarly, the thickness of the deposited coating is, all other things being equal, a function of the residence time of the short fibres and the liquid phase precursor in the microwave field. This allows the skilled person to determine the residence time required to obtain a certain average coating thickness.

The short fibres 14 can be made of carbon or silicon carbide (SiC). For example, such short fibres may be Hi-Nicalon type S fibres marketed by the Japanese company NGS. Silicon carbide short fibres are preferred. Short fibres may have been obtained from continuous long fibres which are cut or ground.

By means of a process according to the invention, an interphase can be formed on the short fibres. For example, a pyrolytic carbon (PyC) interphase can be formed using a coating precursor such as an alcohol, for example ethanol, a polyalcohol or toluene. For example, a silicon carbide interphase may be formed using a coating precursor such as methyltrichlorosilane or dimethylchlorosilane. For example, a boron nitride (BN) interphase may be formed using a coating precursor such as borazine, or a mixture of $BCl_3$ and $NH_3$.

The short fibres thus coated with an interphase can then be used, for example, to manufacture a ceramic matrix composite part.

EXAMPLE

A pyrocarbon interphase is deposited on short silicon carbide fibres by an example process according to the invention. For this purpose, a mixture is prepared comprising short fibres of Hi-Nicalon type S silicon carbide having an average length of the order of 200 μm and 10 μm in diameter (average filament diameter), and ethanol. The mixture is placed in a suitable reactor within the resonant cavity of a resonator having a natural frequency of the order of 2.45 GHz and supplied with 300 W power. The mixture is thus subjected to the microwave field for a period of about 10 minutes. Short fibres coated with a homogeneous and continuous pyrocarbon interphase on the surface of the fibres were obtained.

The invention claimed is:

1. A process for depositing a coating on short fibres of carbon or silicon carbide from a coating precursor, the short fibres having a length of between 50 μm and 5 mm, wherein the process comprises:
   heating the short fibres by placing a mixture comprising said fibres and a liquid phase of the coating precursor in a microwave field so as to bring the surface of the fibres to a temperature allowing the coating on the fibres from the coating precursor to be formed by calefaction, the coating being an interphase coating comprising pyrolytic carbon, boron nitride, silicon carbide, silicon nitride $Si_3N_4$, or SiBN, a liquid phase of the coating precursor coupling with the microwave field so as to bring it to boiling point so that, in said mixture, the fibers are dispersed in said liquid phase during application of the microwave field.

2. The process according to claim 1, wherein the length of the short fibres is between 100 μm and 300 μm.

3. The process according to claim 1, wherein the short fibres are made of silicon carbide having an oxygen content of less than or equal to 1 atomic percent.

4. A method according to claim 1, wherein the microwave field is obtained from a resonator having a resonant cavity.

5. The process according to claim 1, wherein the short fibres are obtained from fibres which are cut or ground.

6. A process for manufacturing a ceramic matrix composite part comprising a step of forming the matrix around short fibres on which a coating has been deposited by a process according to claim 1.

\* \* \* \* \*